United States Patent
Iwasaki

(10) Patent No.: US 8,149,549 B2
(45) Date of Patent: Apr. 3, 2012

(54) MAGNETORESISTIVE HEAD INCLUDING MAGNETORESISTIVE EFFECT FILM OF FIXED LAYER, NON-MAGNETIC LAYER, INSULATING BARRIER LAYER AND FREE LAYER, AND MAGNETIC RECORDING DEVICE WITH MAGNETORESISTIVE HEAD

(75) Inventor: Tomio Iwasaki, Tsukuba (JP)

(73) Assignee: Hitachi, Ltd., Tokyo (JP)

( * ) Notice: Subject to any disclaimer, the term of this patent is extended or adjusted under 35 U.S.C. 154(b) by 528 days.

(21) Appl. No.: 12/367,574

(22) Filed: Feb. 9, 2009

(65) Prior Publication Data

US 2009/0316292 A1 Dec. 24, 2009

(30) Foreign Application Priority Data

Jun. 19, 2008 (JP) .................................. 2008-160178

(51) Int. Cl.
*G11B 5/39* (2006.01)
(52) U.S. Cl. ................................................... 360/324.2
(58) Field of Classification Search ........ 360/313–324.2; 257/421–427; 324/244–263; 365/145, 158, 365/171–173; 428/810–816
See application file for complete search history.

(56) References Cited

U.S. PATENT DOCUMENTS 7,057,921 B2 * 6/2006 Valet .............................. 365/158

FOREIGN PATENT DOCUMENTS

| JP | 2002-026423 | 1/2002 |
| JP | 2003-086861 | 3/2003 |
| JP | 2006-024294 | 1/2006 |

* cited by examiner

*Primary Examiner* — Allen Heinz
(74) *Attorney, Agent, or Firm* — Antonelli, Terry, Stout & Kraus, LLP.

(57) ABSTRACT

A magnetoresistive head is provided with high reliability and produced at a high yield rate. The magnetoresistive head includes a lower magnetic shield layer, an upper magnetic shield layer, a magnetoresistive effect film, and means for causing a current to flow in the direction of the thickness of the magnetoresistive effect film. The magnetoresistive effect film is provided between the lower magnetic shield layer and the upper magnetic shield layer. The magnetoresistive effect film is composed of a fixed layer, a non-magnetic layer, an insulating barrier layer and a free layer. The four layers of the magnetoresistive effect film are formed in this order. The insulating barrier layer is an oxide layer containing at least one of titanium and nickel.

15 Claims, 11 Drawing Sheets

DIRECTION OF HEIGHT OF ELEMENT
OR DIRECTION OF TRACK WIDTH

MAGNETORESISTIVE HEAD INCLUDING MAGNETORESISTIVE EFFECT FILM OF FIXED LAYER, NON-MAGNETIC LAYER, INSULATING BARRIER LAYER AND FREE LAYER, AND MAGNETIC RECORDING DEVICE WITH MAGNETORESISTIVE HEAD

BACKGROUND OF THE INVENTION

1. Field of the Invention

The present invention relates to a magnetoresistive head for reproducing information magnetically stored, a method for manufacturing the magnetoresistive head, and a magnetic recording device having the magnetoresistive head, and more particularly to a magnetoresistive head having a high reproduction output and a magnetic recording device having the magnetoresistive head having the high reproduction output.

2. Description of the Related Art

A recording density of a magnetic recording device has been remarkably increased. It has been requested that a magnetoresistive head provided in the magnetic recording device have a smaller track width and have a high recording property and a high reproducing property. For the high reproducing property, a magnetoresistive head using a magnetoresistive effect has been developed to increase sensitivity of the head. When a recording density is low and approximately several gigabytes per square inch, anisotropic magnetoresistive effect (AMR) has been used to convert a magnetic signal on a recording medium into an electrical signal. When the recording density is higher than the aforementioned value, a giant magnetoresistive effect (GMR) with higher sensitivity is used.

For the request to increase the recording density, a current perpendicular to plan scheme has been researched and developed since a distance (reproduction gap length) between an upper magnetic shield layer and a lower magnetic shield layer has tended to be reduced. The current perpendicular to plan (CPP) scheme has an advantage to increase the sensitivity. In the current perpendicular to plan scheme, a detection current flows in a direction substantially perpendicular to the surface of a film. A magnetic reproduction head using a CPP GMR and a magnetic reproduction head using a tunneling magnetoresistive effect have been reported.

The basic structure of a CPP magnetic reproduction head is described below with reference to FIGS. 1 and 2. FIG. 1 is an outline cross sectional view of the CPP magnetic reproduction head, taken along a direction parallel to a surface of the CPP magnetic reproduction head (or taken along a direction perpendicular to the direction of the height of an element). The surface of the CPP magnetic reproduction head faces a surface of a recording medium and is hereinafter referred to as a medium facing surface. An X axis shown in FIG. 1 is parallel to the direction of a track width of the CPP magnetic reproduction head. A Y axis shown in FIG. 1 is parallel to the direction of the height of the element. A Z axis shown in FIG. 1 is parallel to the direction of the thickness of a magnetoresistive effect film 3. In each of the accompanying drawings following FIG. 1, X, Y and Z indicate the same directions as those of the X, Y and Z axes shown in FIG. 1, respectively. The track width is denoted by an arrow T. A track width direction refill film 1 is in contact with a side wall surface in the direction of the track width of the magnetoresistive effect film 3 as shown in FIG. 1. The magnetoresistive effect film 3 is composed of a fixed layer 31, an insulating barrier layer 32 and a free layer 33. The insulating barrier layer 32 is located between the fixed layer 31 and the free layer 33. A vertical bias application or a side shield layer 5 is not necessarily required. In FIG. 1, reference numeral 2 denotes an upper magnetic shield layer, and reference numeral 4 denotes a lower magnetic shield layer. FIG. 2 is a cross sectional view of the CPP magnetic reproduction head in the direction of the height of the element, taken along line a-a' of FIG. 1. The right side of FIG. 2 indicates the medium facing surface of the magnetic reproduction head. The medium facing surface of the magnetic reproduction head is denoted by reference numeral 112. An element height direction refill film 6 is in contact with a wall surface of the magnetoresistive effect film 3. Alumina, which is an insulating film, is mainly used as a material of the track width direction refill film 1 and a material of the element height direction refill film 6.

The CPP magnetic reproduction head is typically formed to ensure that the magnetoresistive effect film 3 is in electrical contact with the upper magnetic shield layer 2 and the lower magnetic shield layer 4 in order to reduce the reproduction gap length as much as possible. The upper magnetic shield layer 2 and the lower magnetic shield layer 4 serve as electrodes adapted to cause a current to flow in the magnetoresistive effect film 3. When a circuit exists to electrically short the upper and lower magnetic shield layers 2 and 4 except for the magnetoresistive effect film 3, the circuit may serve as a path for leaking a detection current. This may reduce output of the magnetic reproduction head.

The short circuit may be formed at the side wall surface of the magnetoresistive effect film 3. This is relevant with a method for forming the magnetic reproduction head. FIGS. 3A and 3B are flowcharts showing two types of processes for manufacturing the magnetic reproduction head. Each of the processes for manufacturing the magnetic reproduction head has a step for forming the lower magnetic shield layer, a step for forming the magnetoresistive effect film, a step for adjusting the magnetoresistive effect film, and a step for forming the upper magnetic shield layer. A difference between the process shown in FIG. 3A and the process shown in FIG. 3B is the order of the step for adjusting the magnetoresistive effect film in the direction of the height of the element and the step for adjusting the magnetoresistive effect film in the direction of the track width. This order varies depending on the situation. The step for adjusting the magnetoresistive effect film in the direction of the height of the element may be performed before the step for adjusting the magnetoresistive effect film in the direction of the track width. The step for adjusting the magnetoresistive effect film in the direction of the track width may be performed before the step for adjusting the magnetoresistive effect film in the direction of the height of the element.

In the step for adjusting the magnetoresistive effect film in the direction of the height of the element and the step for adjusting the magnetoresistive effect film in the direction of the track width after the step for forming the magnetoresistive effect film, the magnetoresistive effect film 3 is protected by a resist mask 101 having a predetermined size as shown in FIG. 4A. An unnecessary portion of the magnetoresistive effect film 3 is etched as shown in FIG. 4B. In this etching step, an ion beam etching method using an Ar ion, or a reactive ion etching (RIE) method using a chlorine-based gas or a CO-based gas is typically performed. After the etching, the element height direction refill film 6 or the track width direction refill film 1 is formed as shown in FIG. 4C. Then, the resist mask 101 and an unnecessary portion of the refill film(s) are removed by a lift-off method to adjust the magnetoresistive effect film 3 in the direction of the height of the element and in the direction of the track width as shown in FIG. 4D. In the step for adjusting the magnetoresistive effect film 3 in the direction of the track width, the side shield layer or the vertical bias application layer (not shown in FIGS. 4A to 4D) may be formed on the track width direction refill film 1.

During the etching shown in FIG. 4B, the etched portion may be reattached to the wall surface of the magnetoresistive effect film 3. This effect is called reattachment. The re-attached film forms a film made of a metal constituting a part of the magnetoresistive effect film 3 or a part of the lower magnetic shield layer 4, and has a conductive property. Therefore, the re-attached film may serve as a path for leaking the detection current.

JP-A-2003-86861 discloses a method for oxidizing a re-attached film after etching in the step for adjusting the magnetoresistive effect film 3 in the direction of the track width to prevent a detection current from leaking due to reattachment of the substance to the wall surface of the magnetoresistive effect film 3. This method is characterized in that the re-attached film functions as a part of the track width direction refill film due to the oxidization.

JP-A-2002-26423 discloses a method for removing a substance reattached to the wall surface of the magnetoresistive effect film 3. In this method, during the etching shown in FIG. 4B, a predetermined portion of the magnetoresistive effect film 3 formed on the lower magnetic shield layer 4 is masked by a resist mask used for adjustment of the magnetoresistive effect film 3 in the direction of the track width and by a resist mask used for adjustment of the magnetoresistive effect film 3 in the direction of the height of the element. An ion beam is incident on the magnetoresistive effect film 3 at a first incident angle $\theta_1$ with respect to a normal to the surface of the magnetoresistive effect film 3 to etch a portion of the magnetoresistive effect film 3. After the etching, an ion beam is incident on the magnetoresistive effect film 3 at a second incident angle $\theta_2$ ($\theta_2 > \theta_1$) with respect to the normal to the surface of the magnetoresistive effect film 3 to remove the substance reattached to the wall surface of the magnetoresistive effect film 3. In this case, each of the incident angles is formed between the incident direction of the ion beam and a normal to the surface of a substrate.

JP-A-2006-24294 discloses an advanced method compared with the aforementioned method for the two-step etching technique. In the method disclosed in JP-A-2006-24294, a first refill film and a second refill film having lower hardness than that of the first refill film are used to ensure that there is not an area in which an ion beam for removal of a re-attached film is hardly incident on the magnetoresistive effect film 3.

SUMMARY OF THE INVENTION

When a CPP GMR head having a track width of 40 nanometers or less is used, and when the aforementioned two-step etching technique is used, a large amount of a detection current may leak.

An object of the present invention is to provide a magnetoresistive head capable of preventing a large amount of a detection current from leaking.

The present inventors have studied a CPP GMR head having a track width of 40 nanometers or less in order to prevent a detection current from leaking. As a result of the study, the present inventors have found that it is effective that an insulating barrier layer made of a cobalt oxide, a copper oxide or a ruthenium oxide contains at least one of titanium and nickel. In addition, the present inventors have found that it is more effective that the insulating barrier layer has at least one of atomic percent of 2.2 or more of titanium and atomic percent of 2.2 or more of nickel.

According to the present invention, the amount of a leaking detection current is small, and the magnetoresistive head with high output can be realized. In addition, the magnetoresistive head can be manufactured with high reliability and at a high yield rate. A magnetic recording device having the magnetic reproduction head according to the present invention can be realized with a high recording density.

DESCRIPTION OF THE PREFERRED EMBODIMENTS

An embodiment of the present invention is described below with reference to the accompanying drawings.

Figure 1:
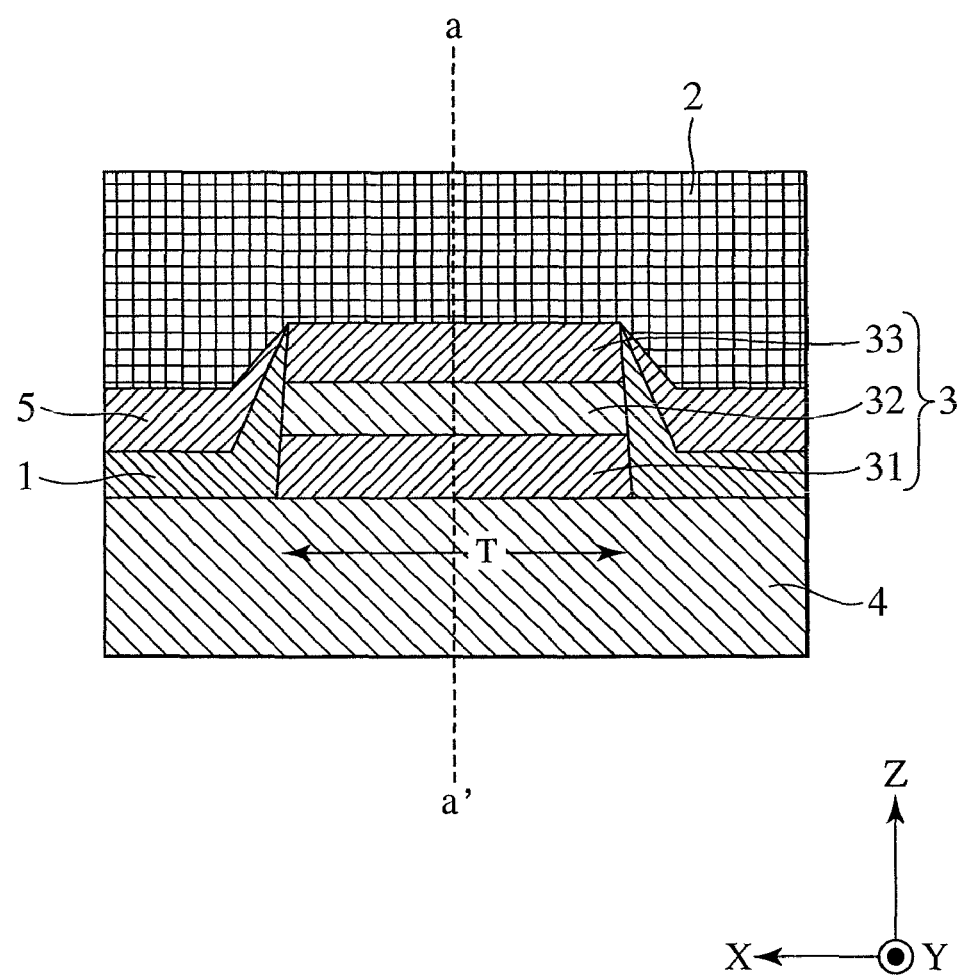
FIG. 1 is an outline cross sectional view of a CPP magnetic reproduction head, and shows the CPP magnetic reproduction head in the direction of a track width.
Figure 2:
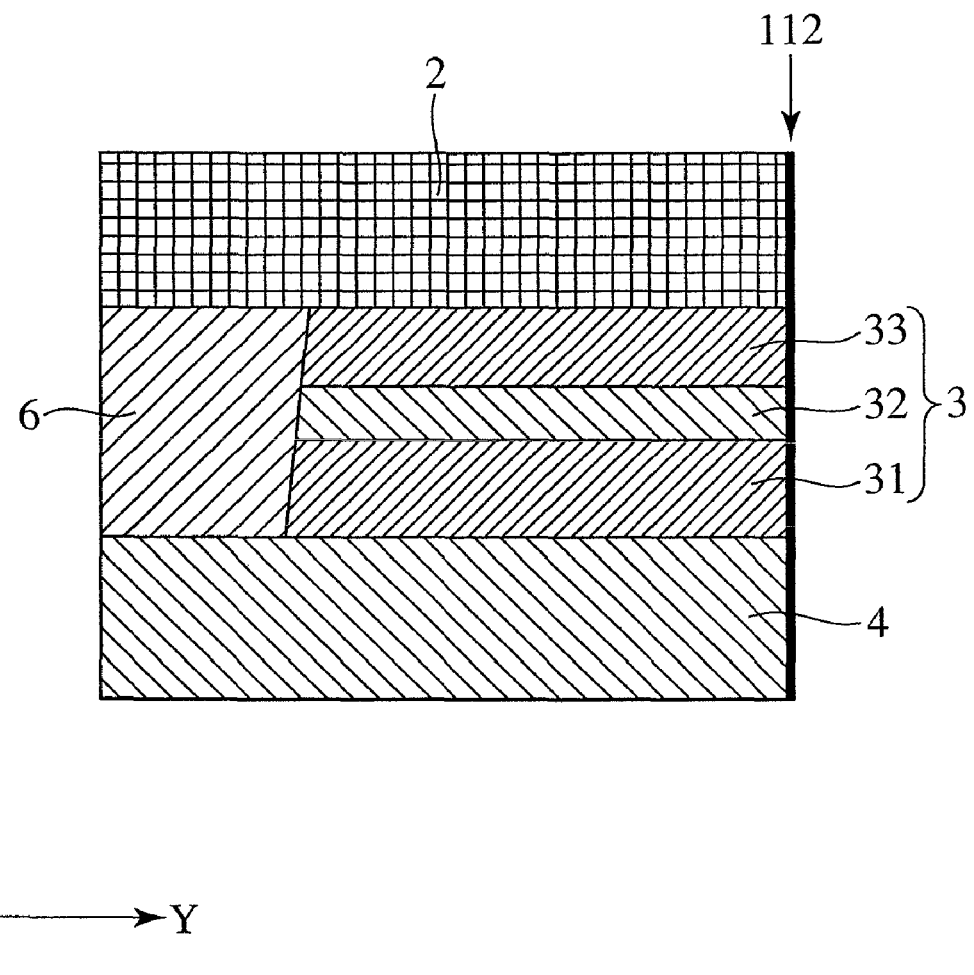
FIG. 2 is an outline cross sectional view of the CPP magnetic reproduction head, and shows the CPP magnetic reproduction head in the direction of the height of an element.
Figure 3A:
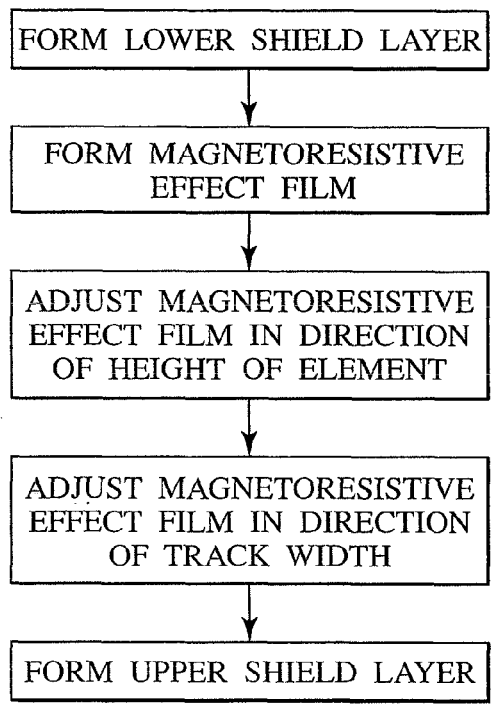
FIGS. 3A and 3B are flowcharts showing processes for manufacturing the CPP magnetic reproduction head.
Figure 3B:
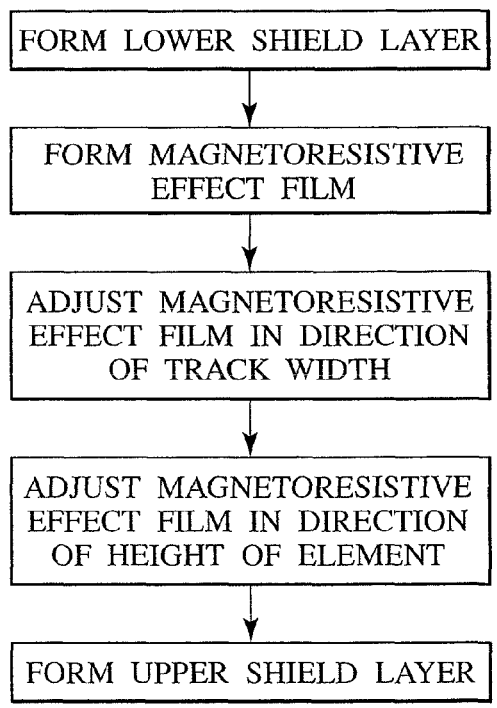
Figure 4A:
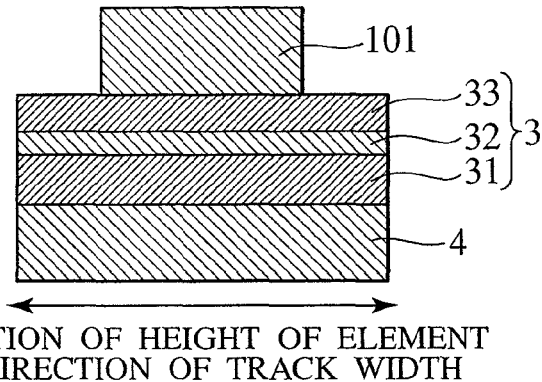
FIGS. 4A to 4D are outline cross sectional views of a conventional magnetic reproduction head and show the process for manufacturing the conventional magnetic reproduction head.
Figure 4B:
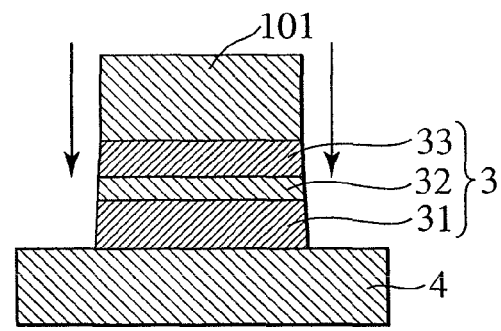
Figure 4C:
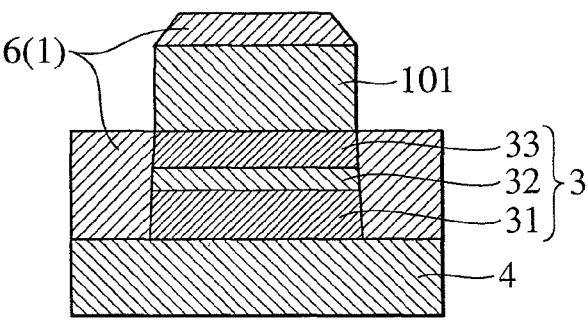
Figure 4D:
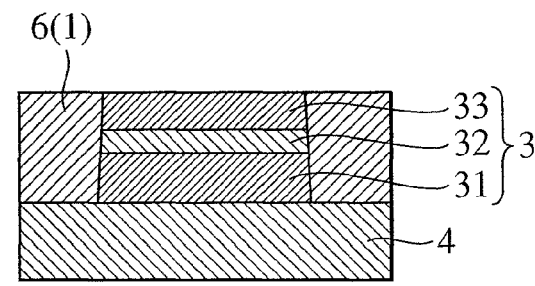
Figure 5:
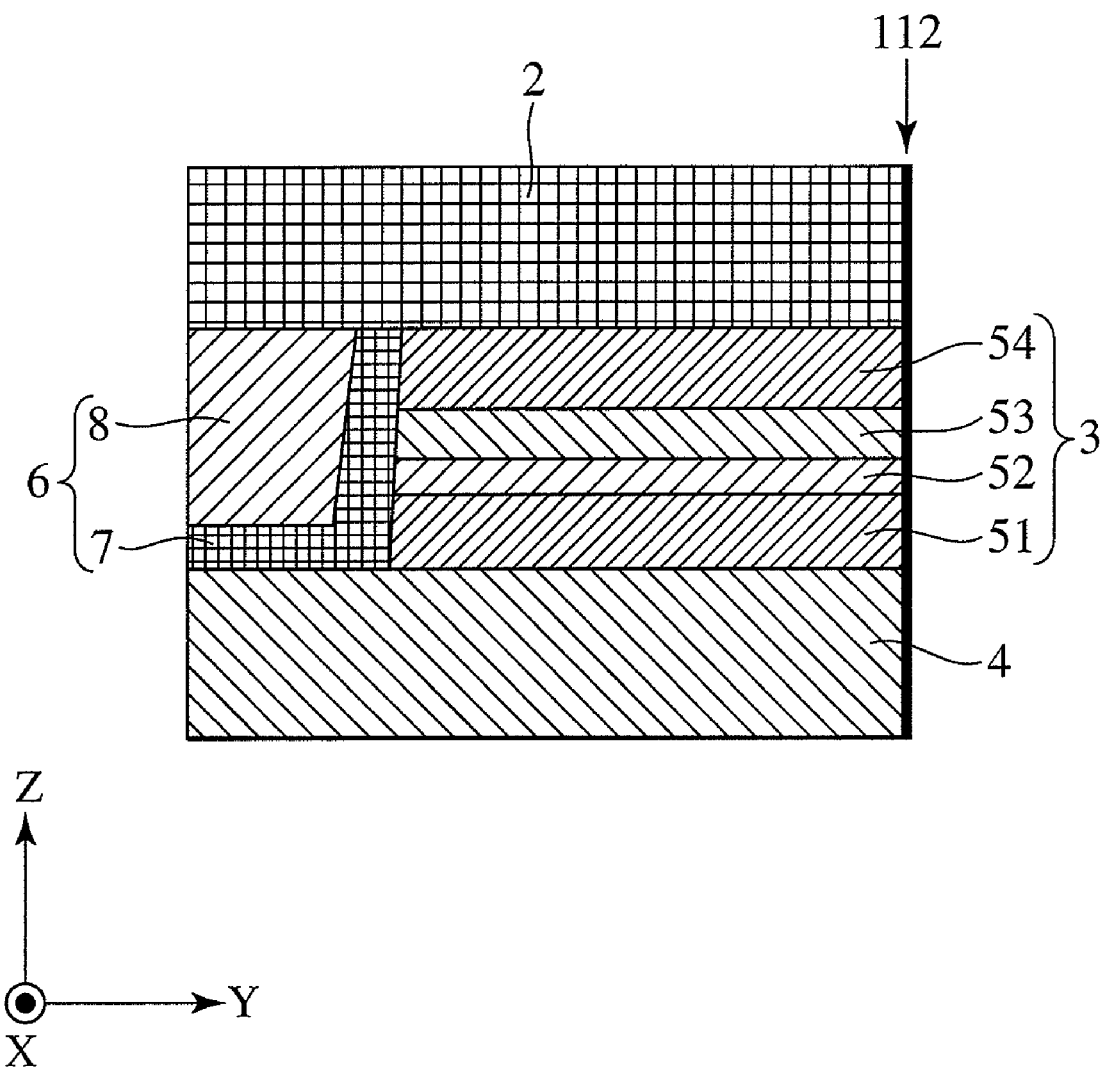
FIG. 5 is an outline cross sectional view of a magnetic reproduction head according to the present invention, and shows the magnetic reproduction head in the direction of the height of an element.

FIG. 5 is a cross sectional view of an example of a sensor part of a magnetic reproduction head according to the present invention, and shows the sensor part in the direction of the height of an element. FIGS. 6A to 6E are cross sectional views of the magnetic reproduction head shown in the direction of the height of the element to explain a method for manufacturing the magnetic reproduction head and shows processes of the manufacturing method.

The method for manufacturing the magnetic reproduction head having a structure shown in FIG. 5 is described with reference to FIGS. 6A to 6E. The magnetic reproduction head according to the present embodiment is manufactured through a method in which a step for adjusting a magnetoresistive effect film in the direction of the height of the element is performed before a step for adjusting the magnetoresistive effect film in the direction of a track width of the magnetic reproduction head. First, an insulating film made of $Al_2O_3$ or the like is formed on the surface of a substrate made of alumina titanium carbide or the like and precisely polished by chemical mechanical polishing (CMP) or the like. After that, a lower magnetic shield layer 4 is formed on the insulating film made of $Al_2O_3$ or the like. Then, an extraction electrode film (not shown) is formed in an area distant from the magnetoresistive effect film 3 in the post-step. In this case, the extraction electrode film is formed by laminating a Ta film, an Au film and a Ta film.

Figure 6A:
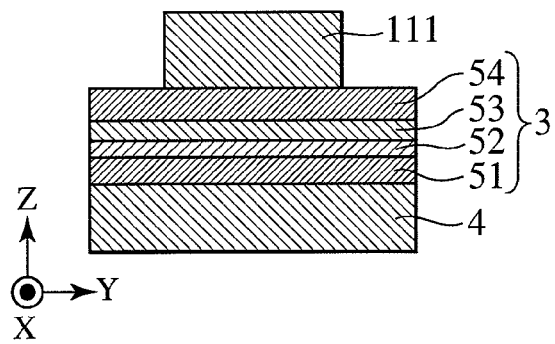
FIGS. 6A to 6E are outline cross sectional views of the magnetic reproduction head according to the present invention shown in the direction of the height of the element, and show a process for manufacturing the magnetic reproduction head according to the present invention.

The magnetoresistive effect film 3 is formed on the lower magnetic shield layer 4 by sputtering or ion beam sputtering as shown in FIG. 6A. The magnetoresistive effect film 3 has a fixed layer 51, a non-magnetic layer 52, an insulating barrier layer 53 and a free layer 54, for example. The fixed layer 51 contains a ferromagnetic body made of a Co—Fe based alloy. The non-magnetic layer 52 is composed of oxide magnesium, oxide aluminum, oxide titanium and the like. The insulating barrier layer 53 is composed of a cobalt oxide film, a copper oxide film or a ruthenium oxide film. The free layer 54 contains a Ni—Fe based alloy, a Co—Fe based alloy or the like. The insulating barrier layer 53 contains at least one of atomic percent of 2.2 or more of titanium and atomic percent of 2.2 or more of nickel as an addition element. Alternatively, the insulating barrier layer 53 contains both titanium and nickel to ensure that the total atomic percent of the titanium and the nickel is 2.2 or more. The non-magnetic layer 52 serves as an adhesive layer to increase adhesion of the insulating barrier layer 53.

Figure 6B:
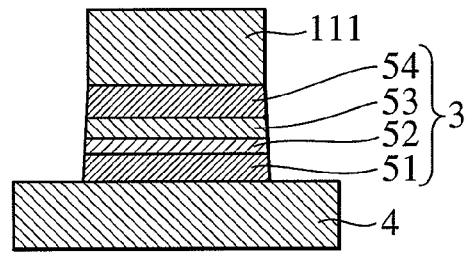

Next, adjustment of the magnetoresistive effect film 3 in the direction of the height of the element is performed. A resist is first coated on the magnetoresistive effect film 3 and then exposed by an exposure device. The resist is then developed with a developer and patterned to ensure that the resist has a desired pattern. The patterned resist is treated as a lift-off mask 111 as shown in FIG. 6A. Polydimethylglutarimide may be coated under the lift-off mask 111 and patterned with the lift-off mask 111 to obtain a two-layer structure. Next, dry etching (first etching) such as ion beam etching or reactive ion etching (RIE) is performed to cause an ion beam or radical flux to be incident on the magnetoresistive effect film 3 at a first incident angle with respect to a normal to the surface of the magnetoresistive effect film 3 to etch a portion of the magnetoresistive effect film 3 in the direction of the height of the element by performing the etching as shown in FIG. 6B.

After the first etching, ion beam etching (second etching) is performed to cause an ion beam to be incident at a second incident angle (larger than the first incident angle) with respect to the normal to the surface of the magnetoresistive effect film 3 in order to allow a substance (re-attached film) reattached to a wall surface of the element during the first etching to be removed. The second incident angle is preferably in a range of 60 degrees to 80 degrees. The adjustment of the magnetoresistive effect film 3 in the direction of the height of the element may be carried out by alternately and repeatedly performing the first etching and the second etching. Alternately, the adjustment of the magnetoresistive effect film 3 in the direction of the height of the element may be carried out by performing the first etching, other etching and the second etching in this order. The other etching is different from the first etching and the second etching or is performed with an ion beam incident at an angle different from the first and second incident angles.

The present inventors have found that oxygen may be removed from the side wall surface of the insulating barrier layer 53 (composed of an oxide layer) of the magnetoresistive effect film 3. In addition, the present inventors have found that when the oxygen is removed, an insulating property of the insulating barrier layer 53 is degraded, and that even when a reattached layer is removed, a large amount of a detection current may leak. When a CPP GMR head having a track width of 40 nanometers or less is used, many crystalline defects are present in an oxide layer (composed of a cobalt oxide film, a copper oxide film or a ruthenium oxide film) having a small width due to such a leakage as described above. The present inventors have found that since oxygen moves through the crystalline defects, the oxygen is easily removed from the side wall surface of the insulating barrier layer and therefore the oxygen defect is liable to be caused.

The present inventors have found that it is effective that the oxide layer constituting the insulating barrier layer 53 contains at least one of titanium or nickel in order to reduce the amount of oxygen removed from the oxide layer. In addition, the present inventors have found that it is more effective that the oxide layer contains at least one of atomic percent of 2.2 or more of titanium and atomic percent of 2.2 or more of nickel or contains both titanium and nickel to ensure that the total atomic percent of the titanium and the nickel is 2.2 or more. The oxide layer containing the aforementioned material(s) prevents oxygen defect and allows the magnetoresistive head having a small track width to be realized.

Figure 6C:
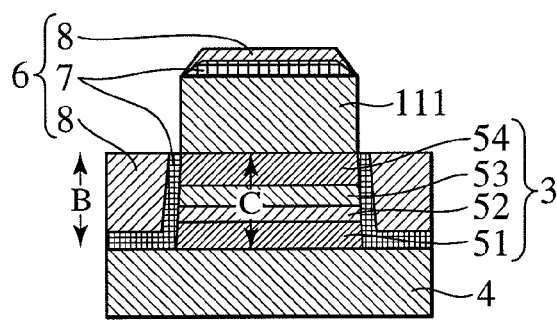
Figure 6D:
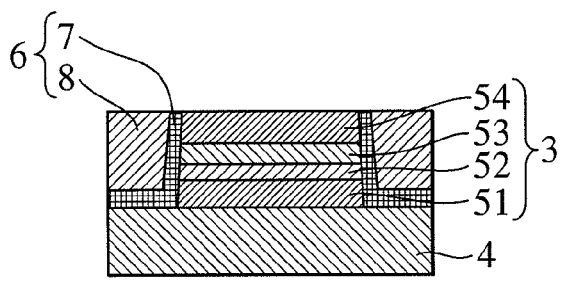

Next, the element height direction refill film 6 composed of a plurality of layers is formed by sputtering or ion beam sputtering as shown in FIG. 6C. In the first etching for adjusting the magnetoresistive head in the direction of the track width, it is preferable to design the configuration and thickness of the element height direction refill film 6 to ensure that the depth of an etched portion of the element height direction refill film 6 is equal to the depth of an etched portion of the magnetoresistive effect film 3. This is desirable in order to ensure that there is not an area in which an ion beam for removal of a re-attached film is hardly incident on the magnetoresistive effect film during the second etching in the following step for adjusting the magnetoresistive effect film 3 in the direction of the track width. This is described in JP-A-2006-24294. The element height direction refill film 6 includes a first refill film 7 and a second refill film 8. The first refill film 7 is in contact with the magnetoresistive effect film 3. In addition, the first refill film 7 is an insulating film. It is preferable that the first refill film 7 be made of alumina to suppress degradation of a characteristic of the magnetoresistive effect film 3 due to heat.

For example, in the case where the ion beam etching is performed as the first etching in the step for adjusting the magnetoresistive effect film 3 in the direction of the track width, the etching rate depends on the hardness of the magnetoresistive effect film 3. It is important that the hardness of the second refill film 8 be lower than the hardness of the first refill film 7. That is, it is desirable that the first refill film 7 be made of an insulating material having high hardness. Specifically, it is desirable that the first refill film 7 be made of alumina, a titanium oxide or the like. The hardness of the first refill film 7 and the hardness of the second refill film 8 can be compared with each other by using Vickers hardness. When alumina is used as a material of the first refill film 7 in consideration of degradation of the characteristic of the magnetoresistive effect film 3 due to heat, a nickel oxide, a silicon oxide, a zirconium oxide, a tantalum oxide or the like may be used as a material of the second refill film 8.

When reactive ion etching using a CO+NH$_3$ based gas or a chlorine based gas is performed as the first etching in the step for adjusting the magnetoresistive effect film 3 in the direction of the track width, the etching rate depends on pressure of a steam of a reaction product. It is therefore preferable that pressure of a steam of a reaction product derived from the second refill film 8 be higher than pressure of a steam of a reaction product derived from the first refill film 7.

The element height direction refill film having the two layers is described above. The element height direction refill film, however, may have third, fourth refill films and more above the second refill film 8. In this case, it is preferable that the added refill films (third, fourth refill films and more) be made of a material(s) capable of being etched at a higher etching rate of the first etching for adjusting the magnetoresistive effect film 3 in the direction of the track width than that at which the first refill film 7 is etched as in the case of the second refill film 8. In addition, it is preferable that the thickness B of the element height direction refill film 6 be close to the thickness C of the magnetoresistive effect film 3 as shown in FIG. 6C in order to easily perform the adjustment in the following step for adjusting the magnetoresistive effect film 3 in the direction of the track width. Then, the lift-off mask 111 is removed by means of an organic solvent to obtain a structure shown in FIG. 6D.

After this step, adjustment of the magnetoresistive effect film 3 in the direction of the track width is performed (the step for adjusting the magnetoresistive effect film 3 in the direction of the track width is not shown). In the step for adjusting the magnetoresistive effect film 3 in the direction of the track width, a resist is used, or a resist and PMGI are used, to create a resist mask as adjustment of the magnetoresistive effect film 3 in the direction of the height of the element. Then, dry etching such as ion beam etching or reactive ion etching (RIE) is performed by means of the created resist mask to cause an ion beam or radical flux to be incident on the magnetoresistive effect film 3 at a first incident angle with respect to a normal to the surface of the magnetoresistive effect film 3 to etch a portion of the magnetoresistive effect film 3 and to thereby adjust the magnetoresistive effect film 3 in the direction of the track width. After the etching, etching is performed to cause an ion beam to be incident on the magnetoresistive effect film 3 at a second incident angle (larger than the first incident angle) with respect to the normal to the surface of the magnetoresistive effect film 3. The second etching allows a substance (re-attached film) reattached to the side wall surface of the element during the first etching to be removed.

In this case, it is preferable that the element height direction refill film 6 have a multi-layer structure and the second refill film 8 be made of a material capable of being etched at a higher etching rate than that at which the first refill film 7 is etched. This is because the side wall surface of the element can be sufficiently irradiated with the ion beam during the second etching to sufficiently remove the reattached layer, when the element height direction refill film 6 has a multi-layer structure and the second refill film 8 is made of a material capable of being etched at a higher etching rate than that at which the first refill film 7 is etched.

It is important that the insulating barrier layer composed of the oxide film contain at least one of titanium and nickel to prevent oxygen from being removed from the side wall surface of the insulating barrier layer of the magnetoresistive effect film 3 in the etching processes.

After the magnetoresistive effect film 3 is etched, a track width direction refill film is formed. As long as a portion of the track width direction refill film, which is in direct contact with the magnetoresistive effect film 3, is made of an insulating material, the track width direction refill film may have a multi-layer structure or a single-layer structure. It is desirable that a layer of the track width direction refill film, which is in direct contact with the magnetoresistive effect film 3, be composed of alumina. A vertical bias application layer or a side shield layer may be formed on the track width direction refill film. However, the vertical bias application layer and the side shield layer are not necessarily required. Finally, the resist mask is removed by means of an organic solvent to complete the adjustment of the magnetoresistive effect film 3 in the direction of the track width.

Figure 6E:
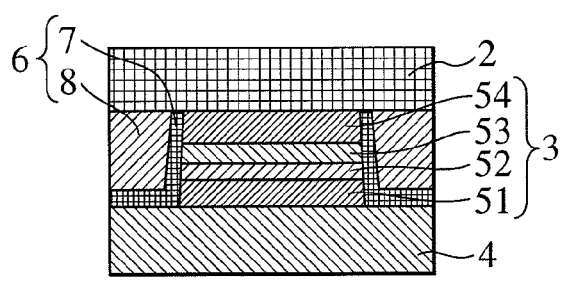

After that, an upper magnetic shield layer 2 made of a soft magnetic body is formed on the magnetoresistive effect film 3 as shown in FIG. 6E. A Metal such as Ta, NiCr and the like may be laminated on the magnetoresistive effect film 3, and then the upper magnetic shield layer 2 made of the soft magnetic body may be formed on the metal. After the upper magnetic shield layer 2 is formed, an extraction terminal is formed. Then, a recording element for recording information in a medium is formed. After that, a medium facing surface 112 of the magnetic reproduction head is formed in a step for slider formation. Then, the magnetic reproduction head (shown in FIG. 5) according to the present invention is obtained.

Figure 7:
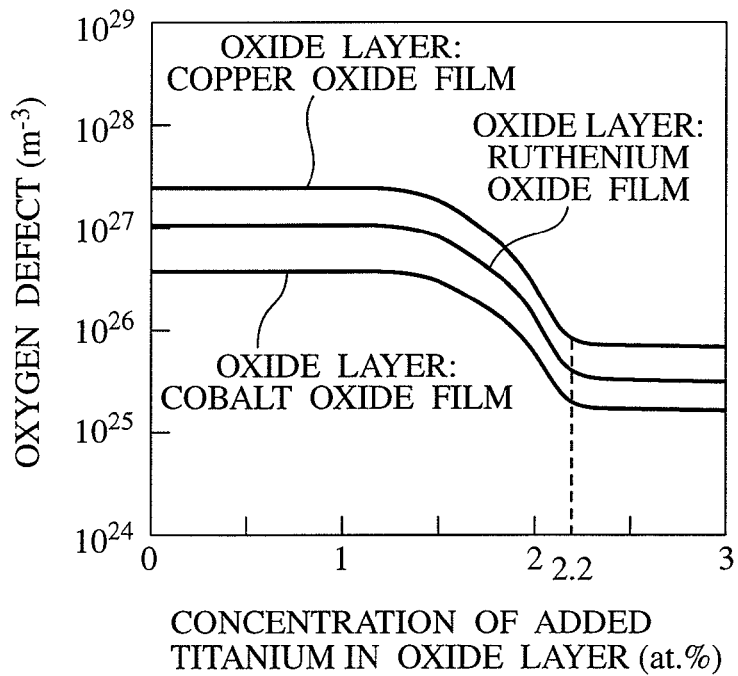
FIG. 7 is a graph showing effects of reductions in oxygen defect when titanium is added to each of oxide films.
Figure 8:
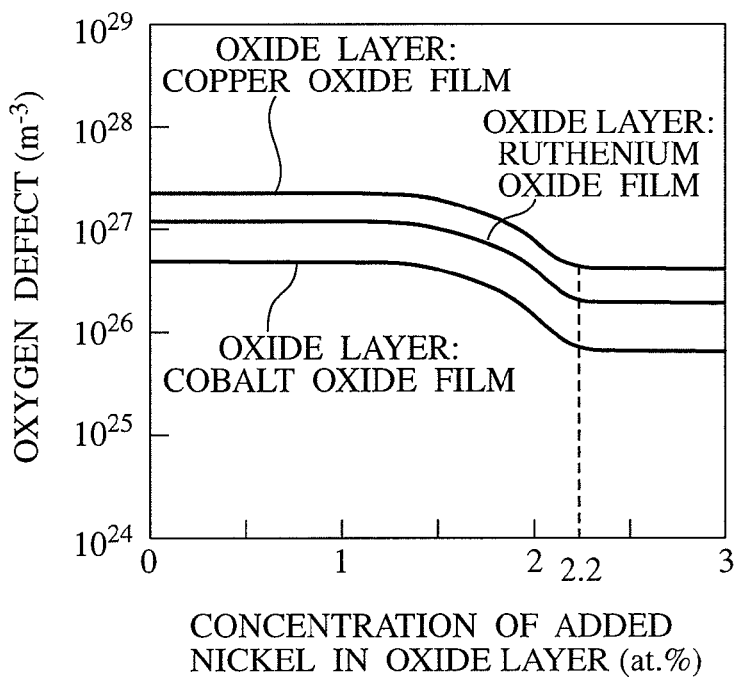
FIG. 8 is a graph showing effects of reductions in oxygen defect when nickel is added to each of the oxide films.
Figure 9:
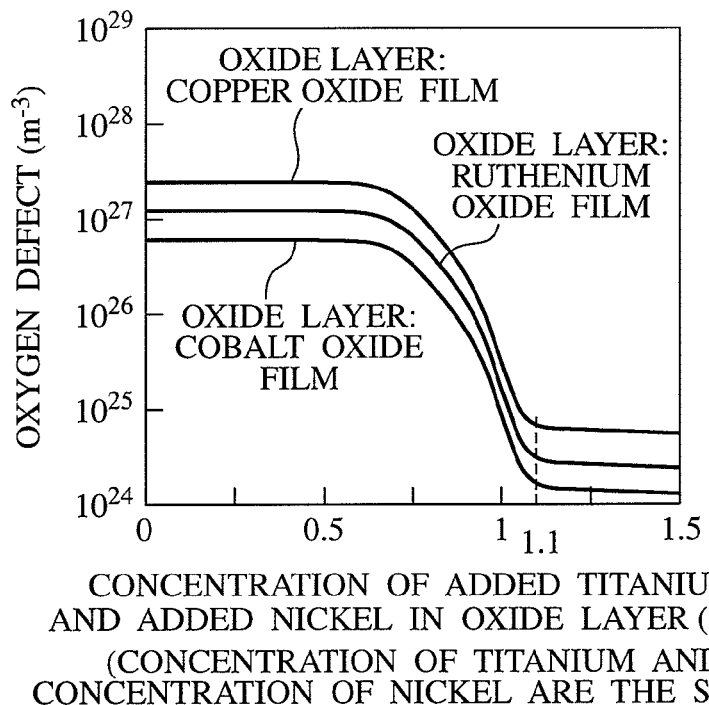
FIG. 9 is a graph showing effects of reductions in oxygen defect when titanium and nickel are added to each of the oxide films.

As described above, it is effective that the insulating barrier layer composed of the oxide film contains at least one of titanium and nickel in order to reduce an oxygen defect. Effects of the reductions in oxygen defect when the track width is 30 nanometers are shown in FIGS. 7 to 9. FIG. 7 shows the effects of the reductions in the oxygen defect when titanium is added to each of the oxide films. FIG. 8 shows the effects of the reductions in the oxygen defect when nickel is added to each of the oxide films. FIG. 9 shows the effects of the reductions in the oxygen defect when titanium and nickel are added to each of the oxide films at the same concentration. The oxygen defects were measured according to a method (disclosed in JP-A-2004-28849) for measuring the lifetime of a positive electron. As apparent from FIG. 7, the oxygen defects are reduced by approximately two digits by adding the titanium to the oxide films. As apparent from FIG. 8, the oxygen defects are reduced by approximately one digit by adding the nickel to the oxide films. As apparent from FIG. 9, the oxygen defects are reduced by approximately three digits by adding the titanium and the nickel to the oxide films. In FIG. 9, the concentration of the added titanium is the same as the concentration of the added nickel. In the case where the titanium and the nickel are added to the oxide films, the concentration of the added titanium may be different from the concentration of the added nickel. When the total concentration of the titanium and the nickel is 2.2 atomic percent or more, the oxygen defects are reduced by one digit to three digits.

Therefore, it is apparent that leaking current is reduced by approximately one digit by adding 2.2 atomic percent of nickel to each of the oxide films; leaking current is reduced by approximately two digits by adding 2.2 atomic percent of titanium to each of the oxide films; and leaking current is reduced by approximately three digits by adding 1.1 atomic percent of titanium and 1.1 atomic percent of nickel to each of the oxide films. In addition, when titanium and nickel are added to the oxide films to ensure that the total atomic percent of the titanium and nickel is 2.2 or more, leaking current is reduced by one digit to three digits. These effects are obtained due to the following fact. That is, since the nickel and titanium that are present in the oxide layer (composed of the cobalt oxide film, the copper oxide film or the ruthenium oxide film) are embedded in crystalline defects present in the oxide layer, oxygen atoms may hardly move in crystals and be hardly removed from the oxide layer. When nickel and titanium are not present, many crystalline defects are present in the oxide layer (composed of the cobalt oxide film, the copper oxide film or the ruthenium oxide film) having a small width and oxygen moves through the defects and is easily removed from the side wall surface. The oxygen defect may result in a path for leaking a detection current. The addition of the titanium and nickel reduces the amount of oxygen defect and reduces the amount of a leaking detection current. This improves reliability and yield rate of the CPP GMR head having the track width of 40 nanometers or less.

When the oxide layer is not composed of any of the cobalt oxide film, the copper oxide film and the ruthenium oxide film, the aforementioned effects cannot be obtained. In addition, the aforementioned effects are obtained when the track width is set to 30 nanometers. The effects are obtained as long as the track width is in a range of 30 nanometers to 40 nanometers.

Figure 10:
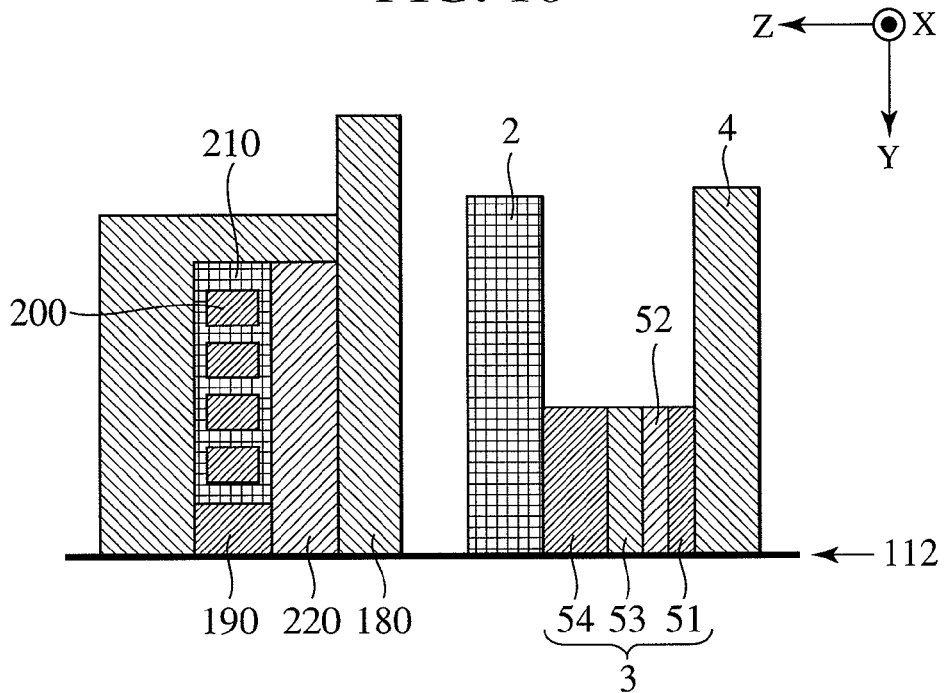
FIG. 10 is an outline cross sectional view of the magnetic reproduction head provided with a recording element for longitudinal magnetic recording.
Figure 11:
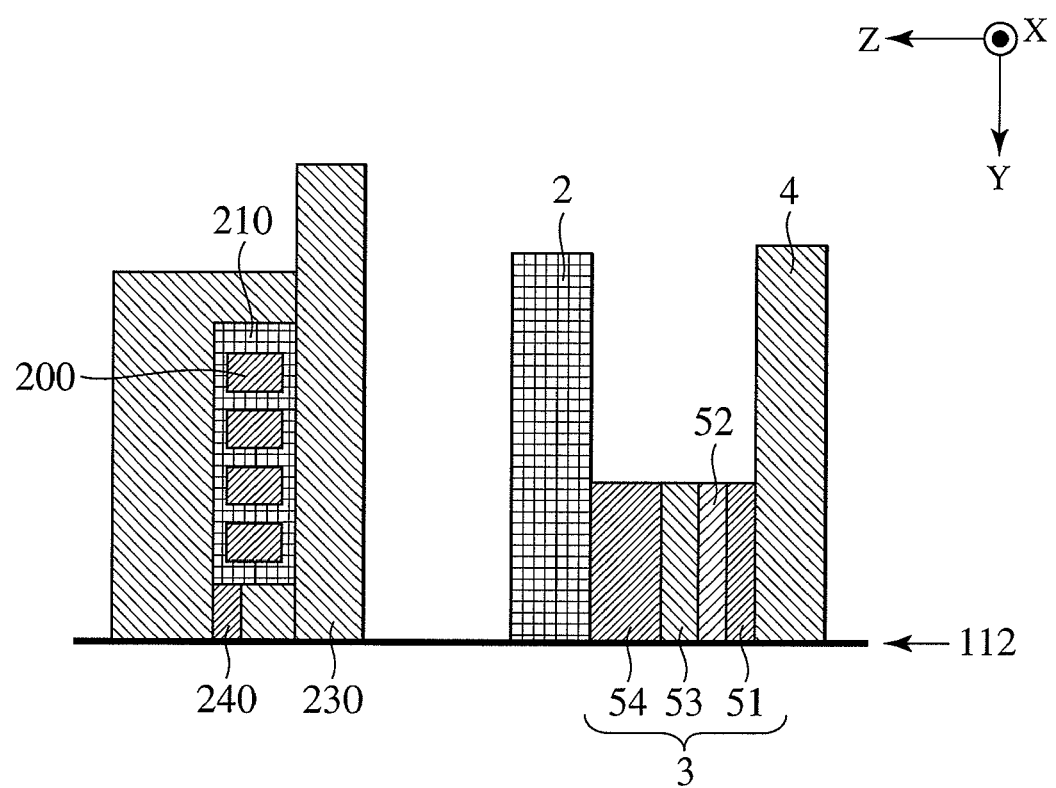
FIG. 11 is an outline cross sectional view of the magnetic reproduction head provided with a recording element for perpendicular magnetic recording.

FIGS. 10 and 11 are outline cross sectional views each showing a magnetoresistive head having a recording element and the magnetic reproduction head according to the present invention. FIG. 10 shows the magnetoresistive head for longitudinal magnetic recording. FIG. 11 shows the magnetoresistive head for perpendicular magnetic recording. As shown in FIG. 10, the recording element provided in the magnetoresistive head for longitudinal magnetic recording has a lower magnetic pole 180, an upper magnetic pole 190, a coil 200, a coil insulating film 210, and a gap 220. As shown in FIG. 11, a single magnetic pole head is used as the recording element provided in the magnetoresistive head for perpendicular magnetic recording. The single magnetic pole has an auxiliary magnetic pole 230, a main magnetic pole 240, a coil 200, and a coil insulating film 210.

Figure 12A:
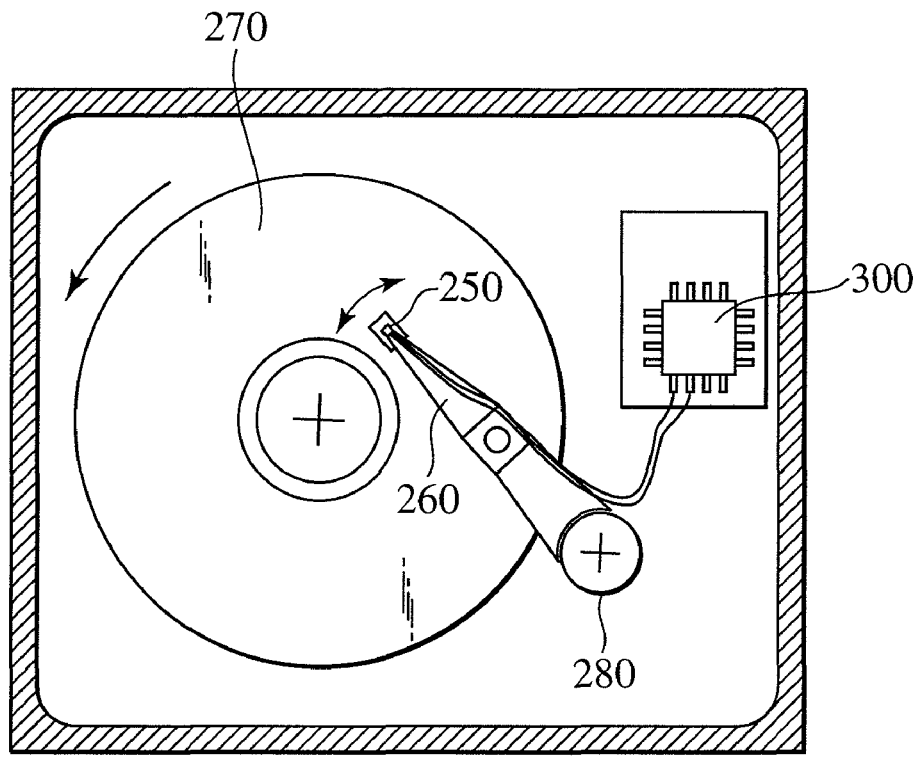
FIGS. 12A and 12B are outline diagrams each showing a magnetic recording device.
Figure 12B:
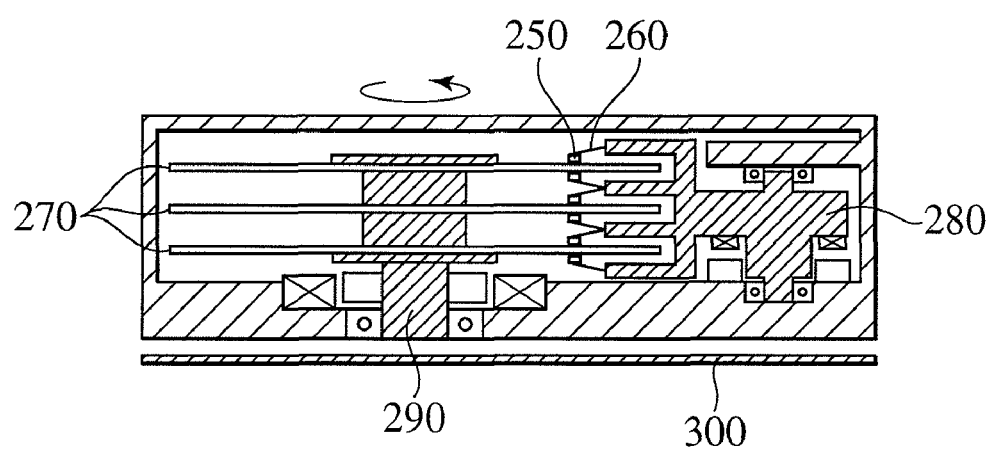

FIGS. 12A and 12B are outline diagrams showing a magnetic recording device. FIG. 12A is an outline plan view of the magnetic recording device. FIG. 12B is an outline cross sectional view of the magnetic recording device. The magnetic recording device has a magnetic recording medium 270, a motor 290, a magnetoresistive head 250, a voice coil motor 280, and a signal processing circuit 300. The motor 290 serves as a driver for rotatably driving the magnetic recording medium 270. The voice coil motor 280 serves as a driver for driving the magnetoresistive head 250. The signal processing circuit 300 is adapted to process a signal input to and output from the magnetoresistive head 250. The magnetoresistive head 250 is the magnetoresistive head (described above) according to the present invention. The reproduction head of the magnetoresistive head 250 has the magnetoresistive effect film. The insulating barrier layer that is provided between the fixed layer and the free layer and composed of the cobalt oxide film, the copper oxide film or the ruthenium oxide film contains at least one of titanium and nickel as an additive element. Therefore, even when the CPP GMR head having a track width of 40 nanometers or less is used, the amount of oxygen removed from the insulating barrier layer can be reduced, and the track width can be reduced. The magnetic recording device can be realized with a high recording density.

The magnetoresistive head 250 is attached to an end portion of a gimbal 260. The magnetoresistive head 250 is driven by the voice coil motor 280 and thereby moved relative to the magnetic recording medium 270 and positioned above a desired track of the magnetic recording medium 270. A recording signal is transmitted from a host device through the signal processing circuit 300 to a recording head of the magnetoresistive head 250. Then, the recording head of the magnetoresistive head 250 causes magnetization of the magnetic recording medium 270 to be inverted to record the signal on the magnetic recording medium 270. A signal indicative of a magnetic field leaked due to the recording magnetization of the magnetic recording medium 270 is detected by the reproduction head of the magnetoresistive head 250. The detected signal is processed by the signal processing circuit 300 and then transmitted to the host device as a reproduction signal by the signal processing circuit 300.

Figure 13:
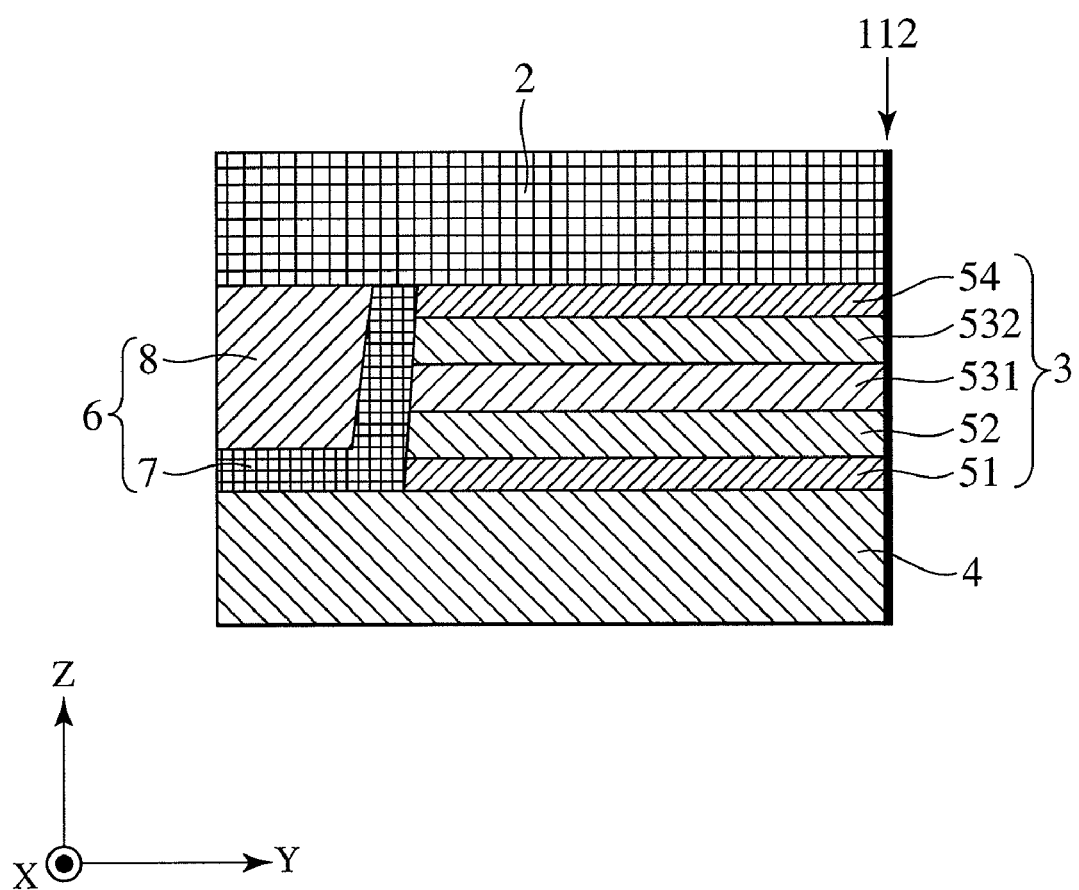
FIG. 13 is an outline cross sectional view of an example of the magnetic reproduction head according to the present invention, and shows the magnetic reproduction head in the direction of the height of the element.

FIG. 13 shows another configuration example of the magnetoresistive head according to the present invention. The magnetoresistive head shown in FIG. 13 is different from the magnetoresistive head shown in FIG. 5 in that an oxide layer (constituting an insulating barrier layer) of the magnetoresistive effect film provided in the magnetoresistive head (CPP GMR head) shown in FIG. 13 has a two-layer structure. The two-layer structure of the oxide layer of the magnetoresistive head shown in FIG. 13 includes a first oxide layer 531 and a second oxide layer 532. Since the insulating barrier layer has the two-layer structure, an interface is present between the two layers 531 and 532. Thus, the number of interfaces of the magnetoresistive effect film 3 shown in FIG. 13 is larger by one than the number of interfaces of the magnetoresistive effect film 3 shown in FIG. 5. The interface between the two layers 531 and 532 serves as a dumper that reduces stress. At least one of the two layers 531 and 532 is an oxide layer (is composed of a cobalt oxide film, a copper oxide film or a ruthenium oxide film) containing at least one of titanium and nickel as an additive element. For example, when the first oxide layer 531 is the cobalt oxide film containing at least one of titanium and nickel as the additive element and the second oxide film 532 is the copper oxide film, this structure makes it possible to reduce the amount of oxygen defect and reduce the amount of a leaking detection current, as described above in the aforementioned embodiment.

What is claimed is:

1. A magnetoresistive head comprising:
   a lower magnetic shield layer;
   an upper magnetic shield layer;
   a magnetoresistive effect film formed between the lower magnetic shield layer and the upper magnetic shield layer; and
   means for causing a current to flow in the direction of the thickness of the magnetoresistive effect film;
   wherein the magnetoresistive effect film is composed of a fixed layer, a non-magnetic layer, an insulating barrier layer and a free layer, the four layers of the magnetoresistive effect film being formed in this order, and
   the insulating barrier layer is a cobalt oxide film containing at least one of titanium and nickel.

2. The magnetoresistive head according to claim 1, wherein
   the cobalt oxide film contains at least one of 2.2 atomic percent or more of titanium and 2.2 atomic percent or more of nickel.

3. The magnetoresistive head according to claim 1, wherein
   the cobalt oxide film contains both titanium and nickel to ensure that the total atomic percent of the titanium and the nickel is 2.2 atomic percent or more.

4. A magnetoresistive head comprising:
   a lower magnetic shield layer;
   an upper magnetic shield layer;
   a magnetoresistive effect film formed between the lower magnetic shield layer and the upper magnetic shield layer; and means for causing a current to flow in the direction of the thickness of the magnetoresistive effect film;

wherein the magnetoresistive effect film is composed of a fixed layer, a non-magnetic layer, an insulating barrier layer and a free layer, the four layers of the magnetoresistive effect film being formed in this order, and the insulating barrier layer is a copper oxide film containing at least one of titanium and nickel.

5. The magnetoresistive head according to claim 4, wherein
the copper oxide film contains at least one of 2.2 atomic percent or more of titanium and 2.2 atomic percent or more of nickel.

6. The magnetoresistive head according to claim 4, wherein
the copper oxide film contains both titanium and nickel to ensure that the total atomic percent of the titanium and the nickel is 2.2 atomic percent or more.

7. A magnetoresistive head comprising:
a lower magnetic shield layer;
an upper magnetic shield layer;
a magnetoresistive effect film formed between the lower magnetic shield layer and the upper magnetic shield layer; and
means for causing a current to flow in the direction of the thickness of the magnetoresistive effect film;
wherein the magnetoresistive effect film is composed of a fixed layer, a non-magnetic layer, an insulating barrier layer and a free layer, the four layers of the magnetoresistive effect film being formed in this order, and
the insulating barrier layer is a ruthenium oxide film containing at least one of titanium and nickel.

8. The magnetoresistive head according to claim 7, wherein
the ruthenium oxide film contains at least one of 2.2 atomic percent or more of titanium and 2.2 atomic percent or more of nickel.

9. The magnetoresistive head according to claim 7, wherein
the ruthenium oxide film contains both titanium and nickel to ensure that the total atomic percent of the titanium and the nickel is 2.2 atomic percent or more.

10. A magnetic recording device comprising:
a magnetic recording medium;
a driver for driving the magnetic recording medium in a recording direction;
a head having a recording section and a reproduction section;
means for moving the head relative to the magnetic recording medium; and
recording and reproducing processing means for performing reproduction processing on a signal to be input to the head and on a signal output from the head;
the reproduction section including:
a lower magnetic shield layer;
an upper magnetic shield layer;
a magnetoresistive effect film formed between the lower magnetic shield layer and the upper magnetic shield layer; and
means for causing a current to flow in the direction of the thickness of the magnetoresistive effect film;
wherein the magnetoresistive effect film is composed of a fixed layer, a non-magnetic layer, an insulating barrier layer and a free layer, the four layers of the magnetoresistive effect film being formed in this order, and
the insulating barrier layer is a cobalt oxide film containing at least one of titanium and nickel.

11. The magnetic recording device according to claim 10, wherein
the cobalt oxide film of the magnetoresistive head contains at least one of 2.2 atomic percent or more of titanium and 2.2 atomic percent or more of nickel.

12. A magnetic recording device comprising:
a magnetic recording medium;
a driver for driving the magnetic recording medium in a recording direction;
a head having a recording section and a reproduction section;
means for moving the head relative to the magnetic recording medium; and
recording and reproducing processing means for performing reproduction processing on a signal to be input to the head and on a signal output from the head;
the reproduction section including:
a lower magnetic shield layer;
an upper magnetic shield layer;
a magnetoresistive effect film formed between the lower magnetic shield layer and the upper magnetic shield layer; and
means for causing a current to flow in the direction of the thickness of the magnetoresistive effect film;
wherein the magnetoresistive effect film is composed of a fixed layer, a non-magnetic layer, an insulating barrier layer and a free layer, the four layers of the magnetoresistive effect film being formed in this order, and
the insulating barrier layer is a copper oxide film containing at least one of titanium and nickel.

13. The magnetic recording device according to claim 12, wherein
the copper oxide film of the magnetoresistive head contains at least one of 2.2 atomic percent or more of titanium and 2.2 atomic percent or more of nickel.

14. A magnetic recording device comprising:
a magnetic recording medium;
a driver for driving the magnetic recording medium in a recording direction;
a head having a recording section and a reproduction section;
means for moving the head relative to the magnetic recording medium; and
recording and reproducing processing means for performing reproduction processing on a signal to be input to the head and on a signal output from the head;
the reproduction section including:
a lower magnetic shield layer;
an upper magnetic shield layer;
a magnetoresistive effect film formed between the lower magnetic shield layer and the upper magnetic shield layer; and
means for causing a current to flow in the direction of the thickness of the magnetoresistive effect film;
wherein the magnetoresistive effect film is composed of a fixed layer, a non-magnetic layer, an insulating barrier layer and a free layer, the four layers of the magnetoresistive effect film being formed in this order, and
the insulating barrier layer is a ruthenium oxide film containing at least one of titanium and nickel.

15. The magnetic recording device according to claim 14, wherein
the ruthenium oxide film of the magnetoresistive head contains at least one of 2.2 atomic percent or more of titanium and 2.2 atomic percent or more of nickel.

* * * * *